(12) United States Patent
Kim

(10) Patent No.: US 9,589,661 B2
(45) Date of Patent: Mar. 7, 2017

(54) METHOD OF PROGRAMMING MEMORY DEVICE AND METHOD OF READING DATA OF MEMORY DEVICE INCLUDING THE SAME

(71) Applicant: SAMSUNG ELECTRONICS CO., LTD., Suwon-si, Gyeonggi-Do (KR)

(72) Inventor: Kyung-Ryun Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 32 days.

(21) Appl. No.: 14/556,107

(22) Filed: Nov. 29, 2014

(65) Prior Publication Data
US 2015/0270852 A1 Sep. 24, 2015

(30) Foreign Application Priority Data
Mar. 20, 2014 (KR) ........................ 10-2014-0032837

(51) Int. Cl.

| | |
|---|---|
| G11C 16/34 | (2006.01) |
| G11C 11/56 | (2006.01) |
| G06F 11/07 | (2006.01) |
| G06F 11/10 | (2006.01) |
| G11C 16/12 | (2006.01) |
| G11C 29/02 | (2006.01) |
| G11C 29/42 | (2006.01) |
| G11C 29/52 | (2006.01) |
| H03M 13/05 | (2006.01) |
| H03M 13/09 | (2006.01) |
| H03M 13/19 | (2006.01) |

(52) U.S. Cl.
CPC ........ *G11C 16/3495* (2013.01); *G06F 11/076* (2013.01); *G06F 11/10* (2013.01); *G06F 11/1048* (2013.01); *G11C 11/5628* (2013.01); *G11C 11/5642* (2013.01); *G11C 16/12* (2013.01); *G11C 16/349* (2013.01); *G11C 29/021* (2013.01); *G11C 29/028* (2013.01); *G11C 29/42* (2013.01); *G11C 29/52* (2013.01); *H03M 13/05* (2013.01); *H03M 13/09* (2013.01); *H03M 13/19* (2013.01)

(58) Field of Classification Search
CPC .............. G11C 16/3495; G11C 16/349; G11C 11/5628; G11C 11/5642; G06F 11/076
See application file for complete search history.

(56) References Cited

U.S. PATENT DOCUMENTS

| | | | |
|---|---|---|---|
| 5,436,913 A | 7/1995 | Yamamura et al. | |
| 5,896,391 A * | 4/1999 | Solheim ................ | H04L 1/0045 |
| | | | 714/704 |

(Continued)

FOREIGN PATENT DOCUMENTS

| | | |
|---|---|---|
| JP | 2012-212312 | 11/2012 |
| KR | 1020000004719 A | 1/2000 |
| KR | 1020070096681 A | 10/2007 |

*Primary Examiner* — Joseph D Torres
(74) *Attorney, Agent, or Firm* — Volentine & Whitt, PLLC

(57) ABSTRACT

A method of programming target memory cells of a nonvolatile memory device includes; programming the target memory cells using an incrementally adjusted program time, reading a code word stored by the target memory cells and determining a bit error rate (BER) associated with the target memory cells in view of the read code word, and if the BER exceeds an upper BER limit, increasing the program time by a unit time.

16 Claims, 15 Drawing Sheets

(56) References Cited

U.S. PATENT DOCUMENTS

| | | | | |
|---|---|---|---|---|
| 6,240,055 B1* | 5/2001 | Takamine | ......... | G11B 7/00718 |
| | | | | 369/44.29 |
| 7,239,557 B2 | 7/2007 | Ha | | |
| 7,417,896 B2 | 8/2008 | Cho et al. | | |
| 7,876,620 B2 | 1/2011 | Mokhlesi et al. | | |
| 8,041,882 B2 | 10/2011 | Jachalsky et al. | | |
| 8,111,554 B2 | 2/2012 | Lutze | | |
| 8,228,728 B1* | 7/2012 | Yang | ................ | G11C 11/5628 |
| | | | | 365/185.03 |
| 8,239,607 B2 | 8/2012 | Laberge | | |
| 2009/0091990 A1* | 4/2009 | Park | ................ | G11C 11/5628 |
| | | | | 365/189.011 |
| 2010/0257309 A1* | 10/2010 | Barsky | ............ | G06F 12/0246 |
| | | | | 711/103 |
| 2010/0332734 A1* | 12/2010 | Chen | ................ | G06F 13/1684 |
| | | | | 711/103 |
| 2011/0231739 A1* | 9/2011 | Kim | ................ | G06F 11/1048 |
| | | | | 714/773 |
| 2012/0239858 A1* | 9/2012 | Melik-Martirosian | | G06F 11/076 |
| | | | | 711/103 |
| 2013/0047044 A1* | 2/2013 | Weathers | ........ | G11C 16/3459 |
| | | | | 714/708 |
| 2013/0094286 A1 | 4/2013 | Sridharan et al. | | |
| 2013/0212315 A1* | 8/2013 | Steiner | ............ | G06F 12/0246 |
| | | | | 711/103 |
| 2014/0032993 A1* | 1/2014 | Yang | ................ | G06F 11/1068 |
| | | | | 714/773 |
| 2014/0095768 A1* | 4/2014 | Kipnis | ................ | H03M 7/55 |
| | | | | 711/103 |

* cited by examiner

METHOD OF PROGRAMMING MEMORY DEVICE AND METHOD OF READING DATA OF MEMORY DEVICE INCLUDING THE SAME

CROSS-REFERENCE TO RELATED APPLICATION

This application claims priority under 35 USC §119 to Korean Patent Application No. 10-2014-0032837 filed on Mar. 20, 2014, the subject matter of which is hereby incorporated by reference.

BACKGROUND

The inventive concept relates generally to memory devices, and more particularly, to program and/or read method(s) (hereafter, singularly or collectively "program/read method") for memory devices.

Flash memory is a particular type of non-volatile memory where data may be electrically programmed and erased. As is commonly understood, the performance of individual memory cells of a flash memory can degrade over time and with repeated programming and/or erasing. As a result of this phenomenon, lightly used (or "early use stage") flash memory cells may be accessed at relatively high speeds, while well worn (or "late use stage") flash memory cells should be accessed only at relatively slow speeds.

SUMMARY

Embodiments of the inventive concept provide program/read methods for a memory device that efficiently control the programming/reading time(s) of memory cells of the memory device based on an error result for programmed data.

In one aspect, the inventive concept provides a method of programming target memory cells of a nonvolatile memory device, comprising; programming the target memory cells to at least one state corresponding to received write data, wherein once programmed to the target memory cells the write data defines program data, providing an error-check result based at least in part on a code-word read from the target memory cells as program data, and controlling a program time for a program operation subsequently used to program the target memory cells based on the error-check result.

In another aspect, the inventive concept provides a method of programming target memory cells of a nonvolatile memory device, comprising; programming the target memory cells to at least one state corresponding to received write data, wherein once programmed to the target memory cells the write data defines program data, determining an error-check result based at least in part on a code-word read from the target memory cells as program data, controlling a program time for a program operation subsequently used to program the target memory cells based on the error-check result, reading the program data from the target memory cells to provide read data, and correcting the read data.

In yet another aspect, the inventive concept provides a method of programming target memory cells of a nonvolatile memory device, comprising; programming the target memory cells using an incrementally adjusted program time, reading a code word stored by the target memory cells and determining a bit error rate (BER) associated with the target memory cells in view of the read code word, and if the BER exceeds an upper BER limit, increasing the program time by a unit time.

BRIEF DESCRIPTION OF THE DRAWINGS

Illustrative embodiments of the inventive concept will be more clearly understood from the following detailed description taken in conjunction with the accompanying drawings.

DETAILED DESCRIPTION OF EMBODIMENTS

Figure 1:
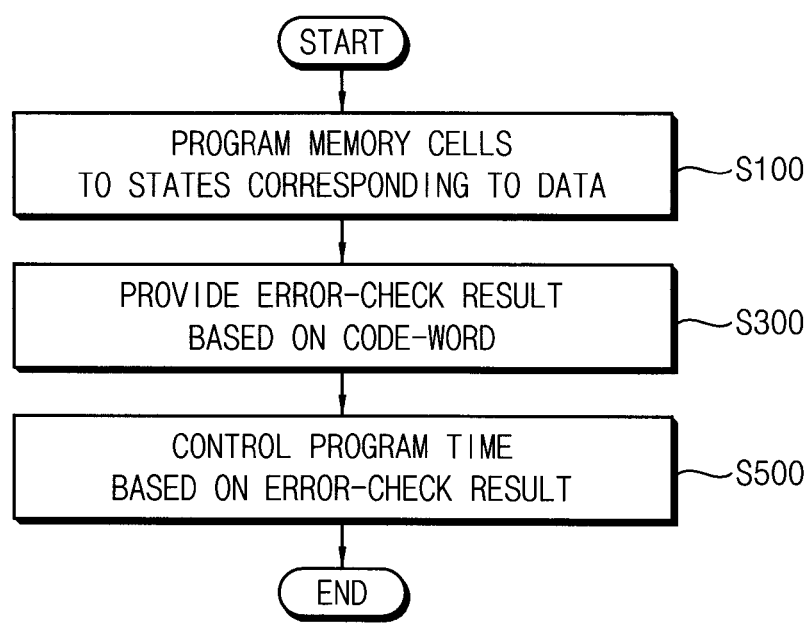
FIG. 1 is a flow chart summarizing a method of programming a memory device according to an embodiment of the inventive concept.

Various embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
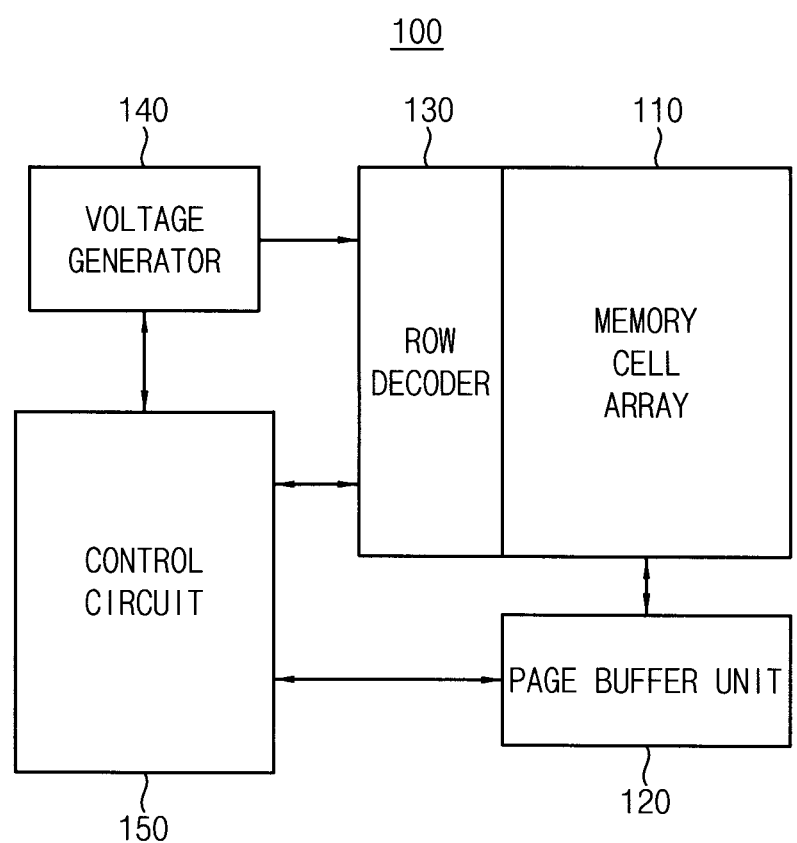
FIG. 2 is a block diagram illustrating a memory device capable of performing methods of programming according to embodiments of the inventive concept.

Figure (FIG. 1 is a flow chart illustrating a method of programming a memory device according to certain embodiments of the inventive concept and FIG. 2 is a block diagram illustrating a memory device capable of performing the method of FIG. 1.

Referring to FIGS. 1 and 2, a nonvolatile memory device 100 is assumed to be a flash memory device. The nonvolatile memory device 100 generally comprises; a memory cell array 110, a page buffer unit 120, a row decoder 130, a voltage generator 140, and a control circuit 150.

Memory cell array 110 arranges multiple memory cells in a matrix formed by multiple word lines and bit lines. The memory cells may be NAND-type and/or NOR-type flash memory cells and may be arranged in a two or three dimensional memory cell array structure. The memory cells may be single level cells (SLCs) configured to store a single binary data bit per each memory cell, or multi-level cells (MLCs) configured to store two or more data bits per each memory cell. Where MLCs are used, various program operations executable during a "write mode" may use one or more schemes, such as for example, a shadow program scheme, a reprogrammable scheme, and/or an on-chip buffered program scheme.

Page buffer unit 120 is connected to the bit lines and stores "write data" programmed in memory cell array 110 or "read data" sensed from memory cell array 110. In other words, page buffer unit 120 may be operated as a write driver or a sensing amplifier according to an operation mode of flash memory device 100. For example, page buffer unit 120 may be operated as the write driver in the write mode and as the sensing amplifier in the read mode.

Row decoder 130 is connected to the word lines and selects at least one of the word lines in response to a row address. Voltage generator 140 generates word line voltages such as a program voltage, a pass voltage, a verification voltage, an erase voltage and a read voltage according to a control of control circuit 150. Control circuit 150 controls page buffer unit 120, row decoder 130 and voltage generator 140 to perform program, erase, and read operations on memory cell array 110.

In certain methods of programming the memory device 100 according to embodiments of the inventive concept, a number of memory cells (hereafter, "target memory cells") included in the memory device 100 may be programmed to one of a number of "states" respectively corresponding to a number of data values (S100). Thus, assuming the use of 2-bit flash MLC in the memory cell array 110 of the flash memory device 100, each flash MLC may have an erase state (E) or one of three program states (e.g., P1, P2 and P3).

After the target memory cells have been programmed, an error-check result based on a code-word may be obtained by reading data from the target memory cells (S300). That is, in order to verify the integrity of the "write data" programmed to the target memory cells, a code-word associated with the write data may be read from the target memory cells. For example, the code-word may include some or all of the write data programmed to the target memory cells as well as parity data derived from the write data. Here, following programming of the write data, certain parity data may be used to detect and/or correct one or more error(s) in the programmed write data once retrieved by execution of a subsequent read operation.

Using this approach, it may be determined whether the target memory cells include one or more "error cells", and the corresponding error-check result may be understood as a rate at which write data bits stored in error cells arise during the programming of the target memory cells. For example, assuming a set of 100 target memory cells, it is determined that 3 of the target memory cells operate as error cells. That is, after the write data is programmed to the 100 target memory cells, the same data read from the 100 target memory cells will include 3 data errors. Accordingly, a corresponding error check result will be 0.03.

Accordingly, in view of a calculated error-check result (ECR) an appropriate "programming time" may be defined form the programming of the target memory cells based on the error-check result (S500). Here, the error-check result ECR may be variously expressed and/or determined (e.g., as a bit error rate BER). Thus, assuming a determined bit error rate BER exceeds a given "upper bit error rate limit (BER_UL), the program time associated with the target memory cells may be extended (or increased).

It should be recognized at this point that the bit error rate will generally be lower for early use stage flash memory cells. But as these flash memory cells undergo repeated program/erase operations, their performance will become degraded to the point where they may be considered late use stage flash memory cells. Thus, after determining a bit error rate for a set of target memory cells in memory device 100, should the bit error rate exceed an upper bit error rate limit, the program time for the target memory cells will be increased by a given unit of time.

In contrast, conventional approaches to programming a flash memory device may count a number of program/erase cycles applied to a set of memory cells. Once this counted number of executed program/erase operations exceeds a prescribed limit—and regardless of any error check result made for the target memory cells—the memory device will merely use thereafter a slow program speed when programming the target memory cells. In many cases, even though the target flash memory cells might continue to be reliably programmed using a fast program speed, because number of counted program/erase cycles exceeds a predetermined limit, the memory device 100 must be programmed using the slow program speed. Therefore even though the flash memory device might be efficiently and reliably programmed using a relatively faster program speed, it will be deemed necessary to use a slower program speed.

Thus, with reference to the method of programming shown in FIG. 1 and the memory device 100 shown in FIG. 2 according to embodiments of the inventive concept, by providing an the error-check result based on a code-word read from target memory cells, the program time subsequently used to program the target memory cells may be effectively and efficiently controlled in view of the error-check result.

Figure 3:
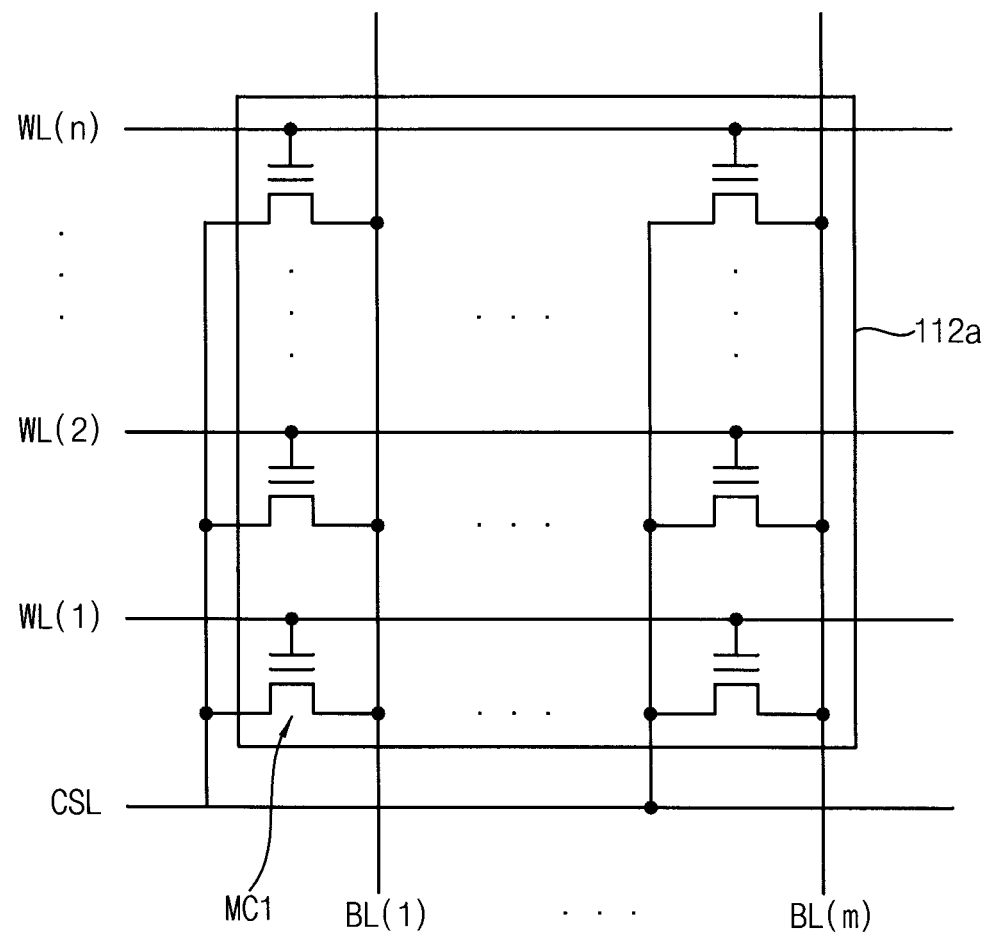
FIGS. 3, 4 and 5 are partial circuit diagrams variously illustrating a memory cell array that may be included in the memory device of FIG. 2.
Figure 4:
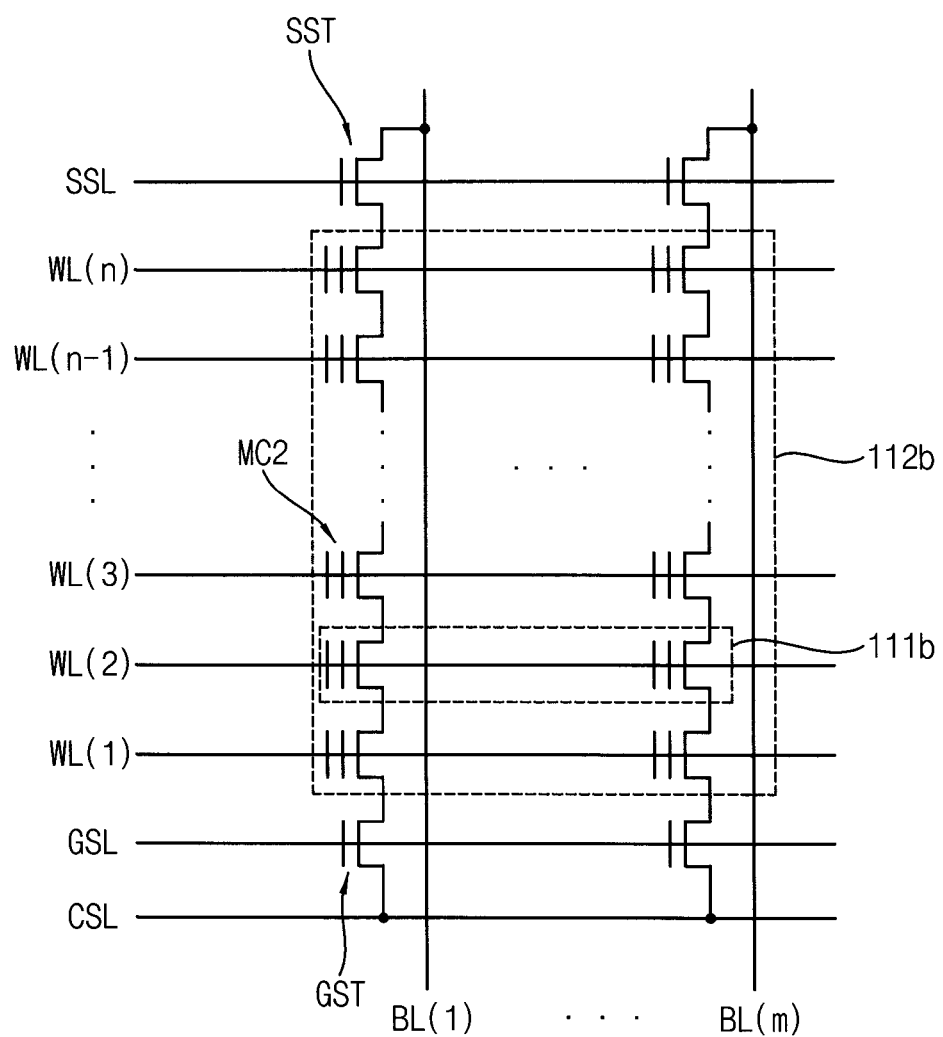
Figure 5:
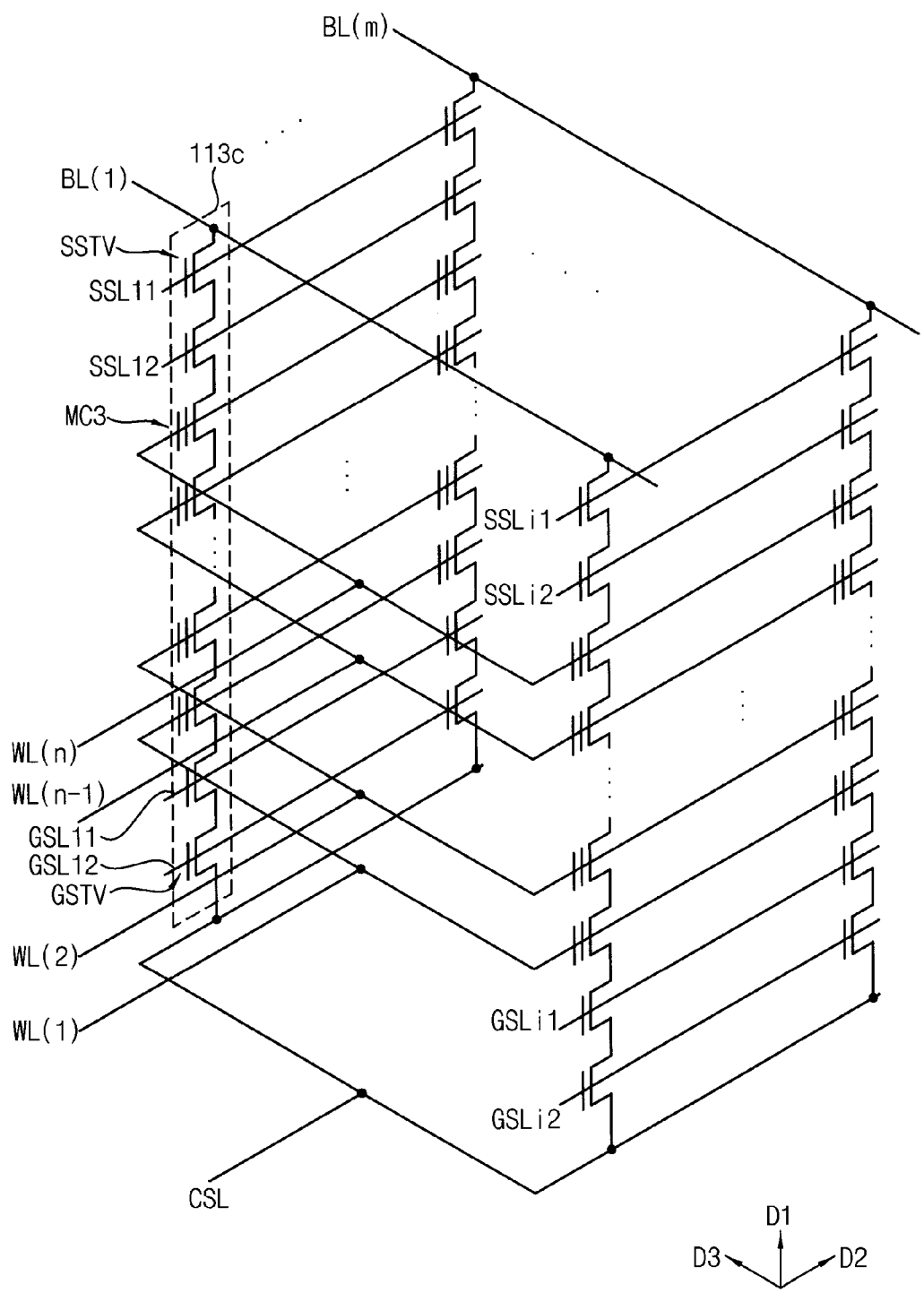

FIGS. 3, 4 and 5 are diagrams illustrating examples of a memory cell array included in the memory device of FIG. 2.

FIG. 3 is a circuit diagram showing in one example a memory cell array including NOR flash memory cells. FIG. 4 is a circuit diagram showing in one example a memory cell array including NAND flash memory cells, and FIG. 5 is a circuit diagram showing in one example a memory cell array that may be incorporated in a vertical flash memory device according to certain embodiments of the inventive concept.

Referring to FIG. 3, a memory cell array 110a includes multiple memory cells disposed at respective intersections of bit lines BL(1), . . . , BL(m) and word lines WL(1), WL(2), . . . , WL(n)). For example one NOR-type flash memory cells (MC1) is disposed in a first row in parallel with a first bit line WL(1) arranged above a common source line CSL. Its gate electrode is disposed in the first row and is connected to the first word line WL(1). Memory cell MC1 may be controlled according to the level of a voltage applied to the first word line WL(1). The NOR flash memory device comprising memory cell array 110a may perform the write and read operations in byte (or word)-sized units and may perform erase operations in block units.

Referring to FIG. 4, memory cell array 110b comprises string selection transistors SST, ground selection transistors GST and memory cells MC2. String selection transistors SST are connected to bit lines BL(1), . . . , BL(m), and ground selection transistors GST are connected to common source line CSL. Memory cells MC2 disposed in the same row are disposed in series between one of bit lines BL(1), . . . , BL(m) and common source line CSL, and memory cells MCs disposed in the same column are connected in common to one of word lines WL(1), WL(2), WL(3), . . . , WL(n–1), WL(n). That is memory cells MC2 are connected in series between string selection transistors SST and ground selection transistors GST, and the word lines of 16, 32, or 64 are disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), . . . , WL(n).

The NAND flash memory device comprising memory cell array 110b performs write and read operations in units of page 111b, and it performs erase operations in units of block 112b. Meanwhile, according to some embodiments, each of the page buffers may be connected to even and odd bit lines one by one. In this case, the even bit lines form an even page, the odd bit lines form an odd page, and the even and odd pages may perform by turns and sequentially the write operation into memory cells MC2.

Referring to FIG. 5, memory cell array 110c comprises multiple strings 113c having a vertical structure. Strings 113c are formed in the second direction to form a string row. Multiple string rows are formed in the third row to form a string array. Each of strings 113c comprises ground selection transistors GSTV, memory cells MC3, and string selection transistors SSTV, which are disposed in series in the first direction between bit lines BL(1), . . . , BL(m) and common source line CSL.

Ground selection transistors GSTV are connected to ground selection lines GSL11, GSL12, . . . , GSLi1, GSLi2, respectively, and string selection transistors SSTV are connected to string selection lines SSL11, SSL12, . . . , SSLi1, SSLi2, respectively. Memory cells MC3 disposed the same layer are connected in common to one of word lines WL(1), WL(2), . . . , WL(n–1), WL(n). Ground selection lines GSL11, . . . , GSLi2 and string selection lines SSL11, . . . , SSLi2 extend in the second direction and are formed along the third direction. Word lines WL(1), . . . , WL(n) extend in the second direction and are formed along the first and third directions. Bit lines BL(1), . . . , BL(m) extend in the third direction and are formed along the second direction. Memory cells MC3 are controlled according to a level of a voltage applied to word lines WL(1), . . . , WL(n).

Because the vertical flash memory device comprising memory cell array 110c comprises NAND flash memory cells, like the NAND flash memory device, the vertical flash memory device performs the write and read operations in units of pages and the erase operation in units of block.

In certain configurations, two string selection transistors in one string 113c are connected to one string selection line and two ground selection transistors in one string are connected to one ground selection line. Further, in certain configurations, one string comprises one string selection transistor and one ground selection transistor.

Figure 6:
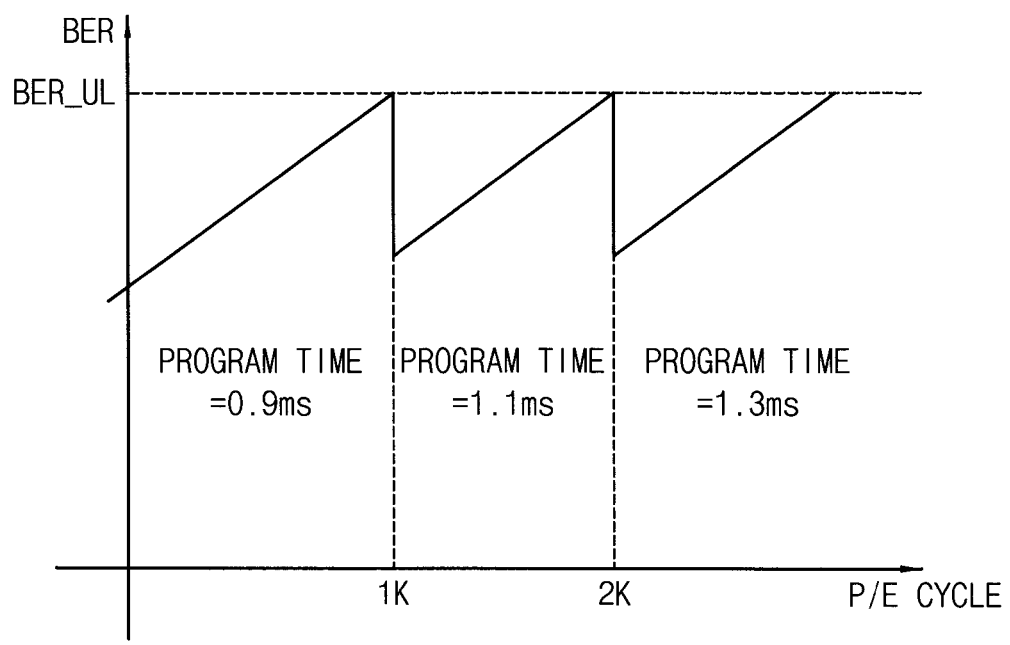
FIG. 6 is a diagram illustrating a bit error rate (BER) as a function of program/erase cycles.

FIG. 6 is a diagram illustrating a bit error rate (BER) as a function of executed program/erase (P/E) cycles.

Referring to FIG. 6, the BER for memory cells of the memory device 100 is relatively low at early use stages of the executed P/E cycles. However, as the number of executed P/E cycles increases, the BER rises. Thus, the memory cells of the memory device 100 may be effectively and efficiently programmed using a relatively fast program speed during the early use stage of the P/E cycle. As the memory cells of the memory device 100 are repeatedly subjected to an increasing number of P/E operations, their corresponding BER rises until it reaches a defined upper bit error rate limit (BER_UL). Once the BER exceeds the upper bit error rate limit, certain memory cells of the memory device 100 may begin to operation abnormally. Accordingly, the program time for the increasing worn memory cells is extended (e.g.,) incrementally through a sequence of slower and slower program speeds. FIG. 6 illustrates, for example, a three step sequence of program speeds having respectively a 0.9 ms program time, a 1.1 ms program time and a 1.3 ms program time. Each time the BER for the target memory cells exceeds the defined upper bit error rate limit (BER_UL) while using a given programming approach characterized by a program time, the programming approach is changed to use a different programming approach having a longer program time. And each time the program time is extended, the number of error cells among the target memory cells decreases.

In the foregoing description, an "error cell" is a memory cell providing a value during a read operation that is different from a value of the write data originally programmed to the memory cell. For example, assuming a data value of "1" was programmed to a target memory cell, if a "1" is read from the target memory cell, it is deemed a "normal cell". However, if a "0" is read, the target memory cell is deemed an error cell.

The embodiment illustrated in FIG. 6 further assumes that the BER performance of the constituent memory cells of the memory device 100 first exceed the established upper BER limit after execution of 1000 program/erase operations, and next exceed the established upper BER limit after execution of another 1000 program/erase operations (for a total of 2000). However, such counted numbers of executed P/E operations are informational in nature and do not directly control the definition of the program time for the target memory cells. Rather, actual bit error rate performance is determined and used to select (or adjust) a particular programming approach to be used on the memory cells.

Figure 7:
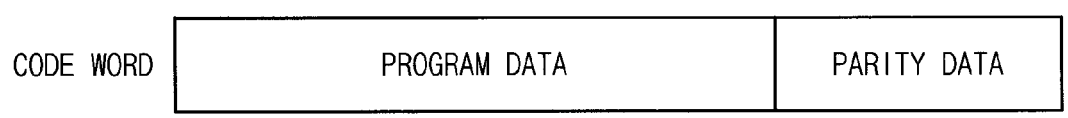
FIG. 7 is a conceptual diagram illustrating in one example a code-word that may be used in conjunction with certain methods of programming the memory device of FIG. 2.

FIG. 7 is a conceptual diagram illustrating in one example a code-word that may be used in accordance with certain methods of programming the memory device of FIG. 2.

Referring to FIG. 7, the code-word includes both program data (i.e., write data provided to the memory device 100 and programmed to target memory cells) and corresponding parity data. One or more error(s) in the program data, as read by a subsequently performed read or verify operation, may be detected and/or corrected using the parity data.

For example, a conventionally understood Hamming code might be used during an error detection/correction operation applied to the program data based on the parity data. Under this assumption and further assuming 16-bit program data, 5-bit parity data may be used. Assuming 32-bit program data, 6-bit parity data may be used.

Figure 8:
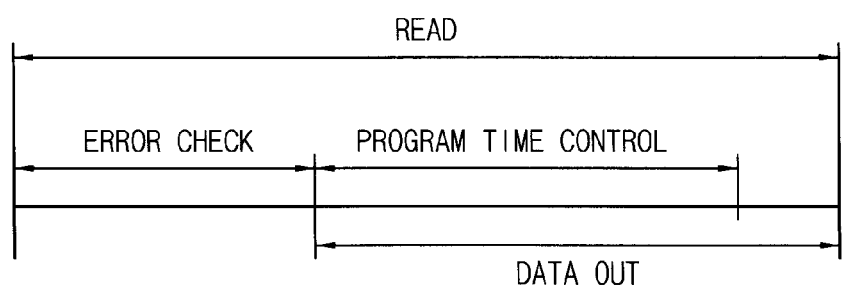
FIG. 8 is a timing diagram describing the execution of a method of defining a program time used during subsequent programming of a memory device during a read operation period.

FIG. 8 is a timing diagram illustrating in one example a method of programming a memory device according to certain embodiments of the inventive concept.

Referring to FIGS. 2 and 8, it is assumed that the memory device 100 may operate in a read mode (READ), and that the memory device 100 may perform an error detection/correction operation (ERROR CHECK) during a period allocated for execution of a read operation in relation to identified program data. Thus, a method of programming target memory cells in the memory device 100 may include an ERROR CHECK directed to the program data, and a subsequent program time control operation may be performed by the memory device 100 in view of (e.g.,) an error-check result obtained by the ERROR CHECK operation. Further, these operations may both be performed during a period of time allocated to the execution of a read operation providing the program data (now, output as "read data").

In this manner, operational steps necessary to the execution of certain methods consistent with the inventive concept may be performed in parallel (or in the shadow) of a read operation. The BER (or error-check rate) determined by the ERROR CHECK operation may be used during the PROGRAM TIME CONTROL operation to properly define a program time that will be used to next program the target memory cells.

Figure 9:
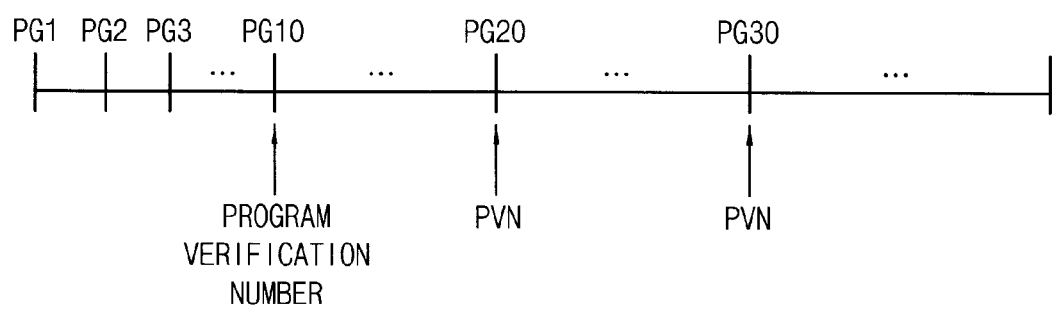
FIG. 9 is a diagram describing how a program verification number may be used in a method of programming a memory device like the one shown in FIG. 2.

FIG. 9 is a diagram illustrating the use of a particular program verification number during a method of programming the memory device of FIG. 2 consistent with an embodiment of the inventive concept.

Referring to FIG. 9, in cases where a program operation number of the memory device 100 is greater than a program verification number (PVN), the providing of an error-check result and the subsequent controlling of the program time may be performed. Each program verification number may be a number of performing the program operation while providing the error-check result and controlling the program time are one-time performed. It is not efficient for the program time control operation to be too frequently performed. Thus, for example, the program time control operation may not be executed until a program operation has been performed nine (9) times in the illustrated example of FIG. 9. Then, upon the tenth execution of the program operation, the error-check result is obtained and the program time control operation is one-time performed. Hence, the associated program verification number (PVN) is 10 in this example, such that whenever the program operation is performed ten times, the program time control operation may be executed as described above.

Figure 10:
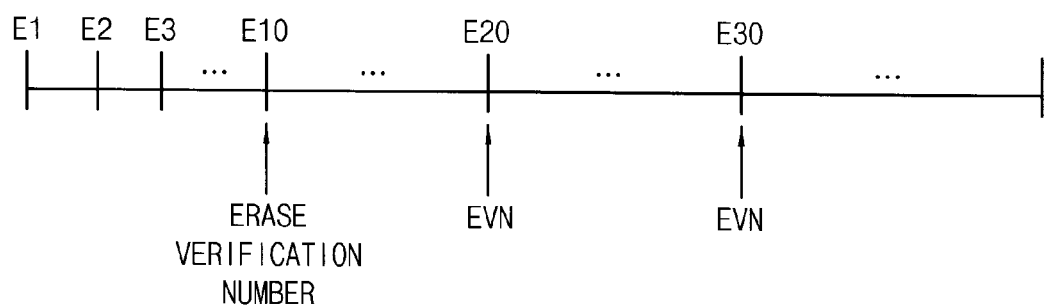
FIG. 10 is a diagram describing how an erase verification number may be used in a method of programming a memory device like the one shown in FIG. 2.

FIG. 10 is a diagram illustrating the use of a particular erase verification number during a method of programming the memory device of FIG. 2 consistent with an embodiment of the inventive concept.

Referring to FIGS. 2 and 10, a counted number of erase operations operates in a manner similar to that of the counted number of program operations in FIG. 9. Thus, an erase verification number (EVN) may be used instead of a program verification number (PVN).

Figure 11:
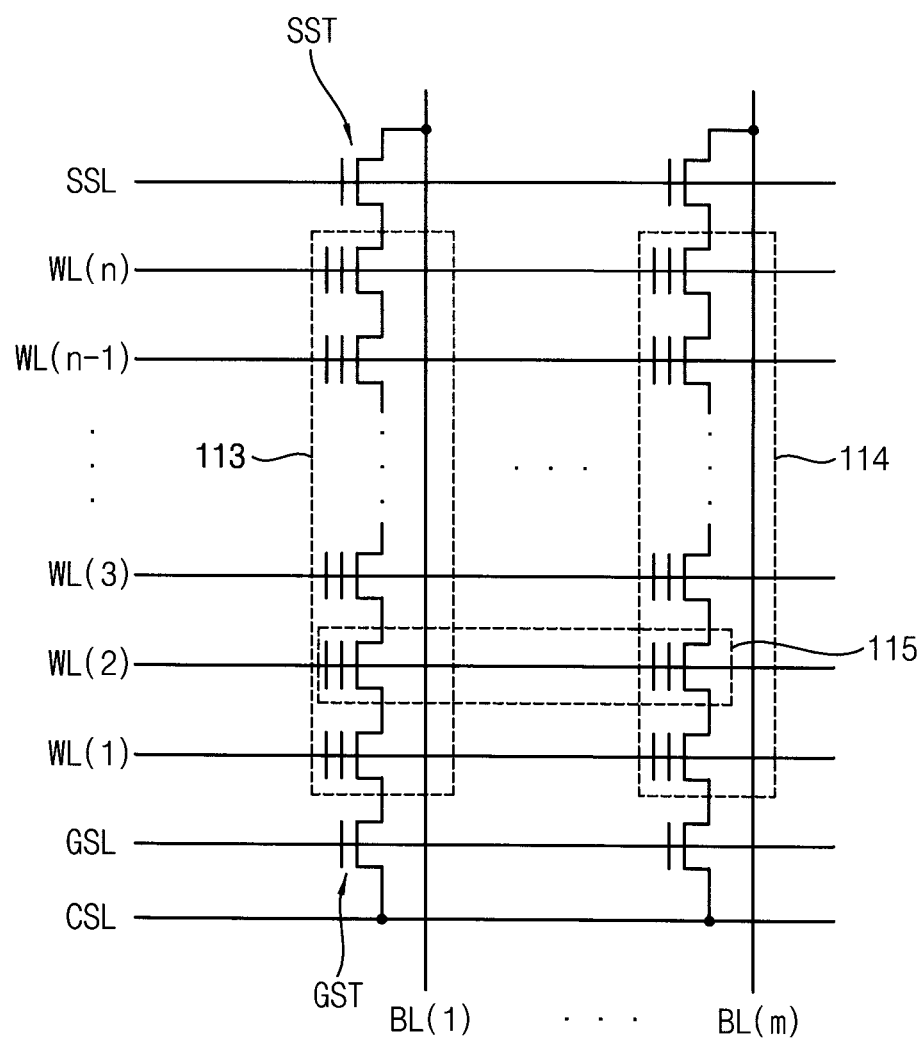
FIGS. 11 and 12 are partial circuit diagrams illustrating various examples of blocks that may be designated within the memory device of FIG. 2.

FIG. 11 is a partial circuit diagram illustrating in one example a number of blocks included in the memory device of FIG. 2.

Referring to FIG. 11, various program times may be controlled by assigning a different number of operations (PVN, EVN) associated with the performing of an error check operation capable of obtaining an error-check result ECR for each of the blocks included in the memory device 100. For example, in a case where a BER for a block 1 (113) is high and a BER for a block 2 (114) and a block 3 (115) are low, the PVN or EVN used to control of performing the error check operation for the block 1 113 may be greater than the PVN or EVN used to control the performing of the error check operation for the block 2 114 and the block 3 115.

Figure 12:
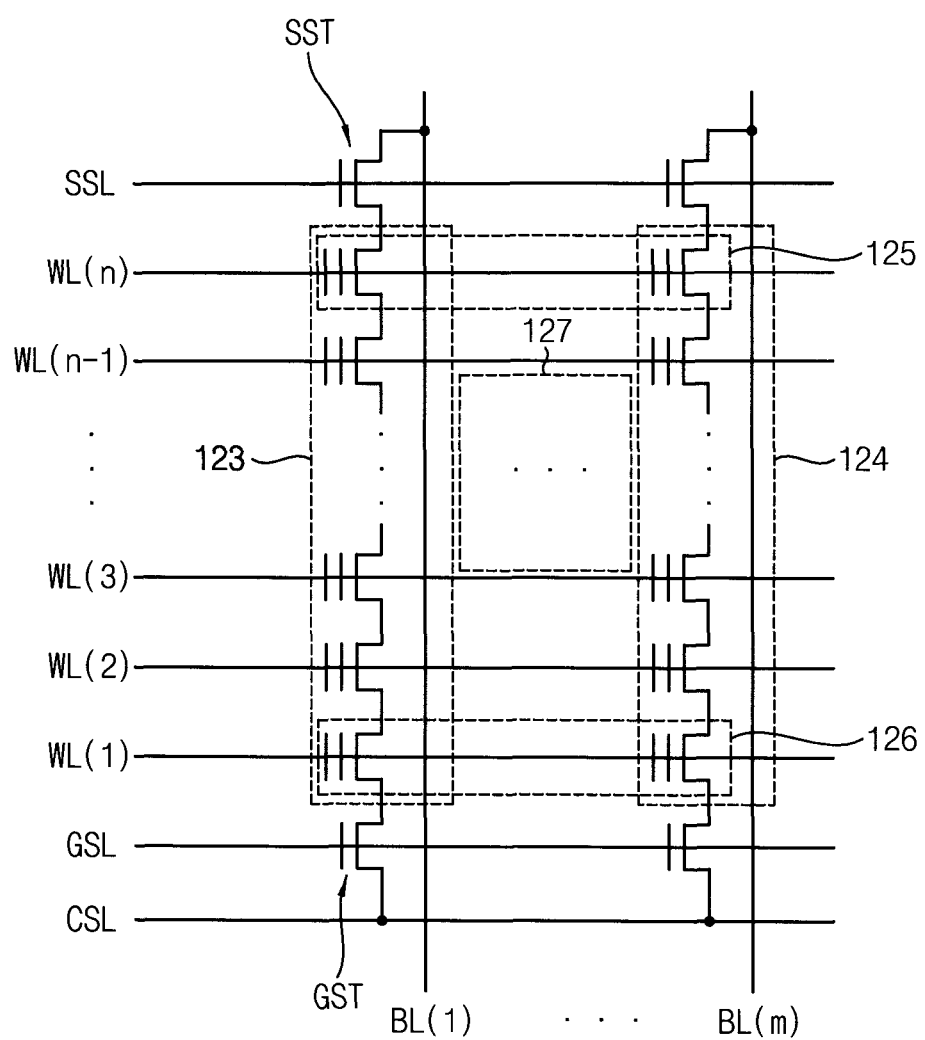

FIG. 12 is a partial circuit diagram illustrating another example of blocks that may be included in the memory device 100 of FIG. 2.

Referring to FIG. 12, an EVN or a PVN used to control the provision of an error-check result for an "outer block" disposed near an outer edge of the memory cell array may be greater than an EVN or a PVN used to control the provision of an error-check result for a "center block" disposed more proximate a center of the memory cell array.

It will be understood, that in general, the BER of outer blocks will be higher than the BER of center blocks. Therefore the EVN/PVN used to control the provision of an error-check result and the execution of a program time control operation for an outer block will be different from the EVN/PVN number used for a center block. For example, outer blocks 1 (123), 2 (124), 3 (125) and 4 (126) are shown in FIG. 12, while block 5 (127) is deemed a center block.

FIG. 13 is timing diagram again illustrating bit error rate (BER) as a function of program/erase (P/E) cycle for a relatively lower performance flash memory. FIG. 14 is the same type of diagram for a relatively high performance flash memory.

Figure 13:
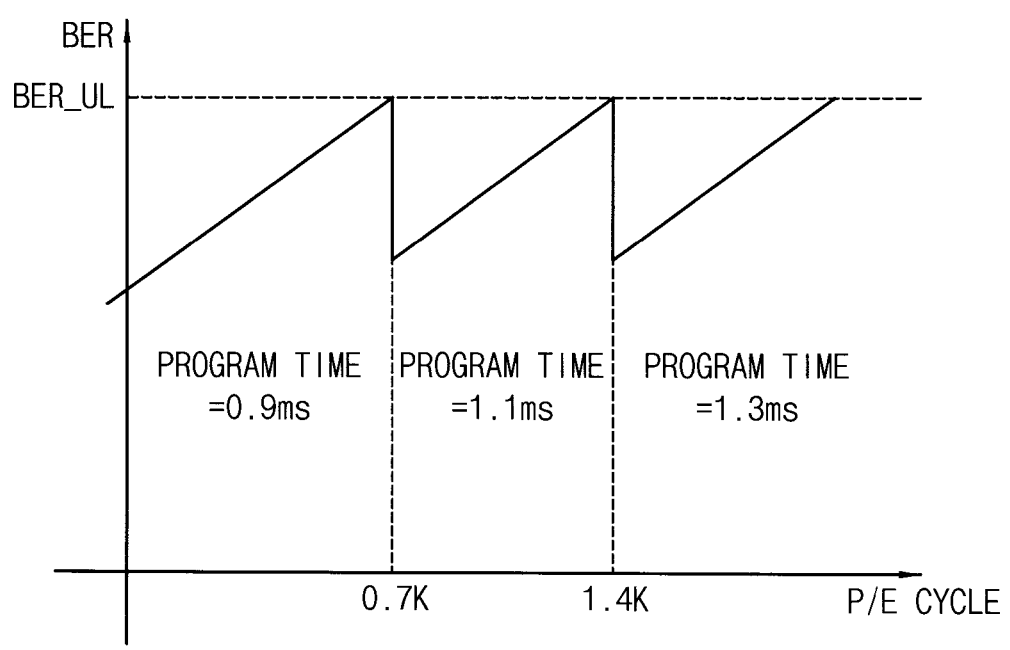
FIGS. 13 and 14 are comparative diagrams illustrating bit error rates verses program/erase cycles for both lower and higher performance flash memories.
Figure 14:
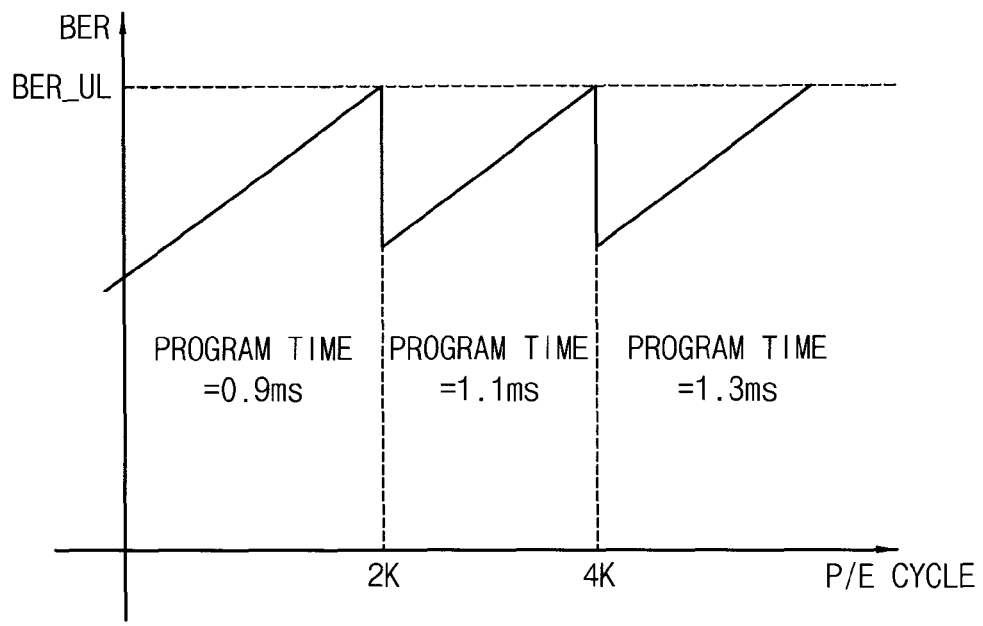

Referring to FIGS. 13 and 14, the BER increases with an increasing number of P/E cycles until it reaches an upper bit error rate limit (BER_UL), whereupon the program time may be increased.

In the illustrated comparative examples, the BER of the lower performance flash memory exceeds the BER_UL after only 700 P/E cycles at which time the program time is increased. Here, a fixed increment in program time of 0.2 ms is assumed. In contrast, the BER of the higher performance flash memory exceeds the BER_UL after execution of 2000 P/E cycles at which time the program time is increased. In this manner, actual BER performance for respective memory devices may be used to control and define an appropriate program times, rather than using a set count of executed P/E operations.

Consistent with the foregoing, methods of programming a memory device 100 according to embodiments of the inventive concept provide at appropriate intervals error-check results derived by reading a code-word from target memory cells. Then, based on the error-check results, a program time for respective target memory cells may be established, so that memory devices may be efficiently and carefully used with appropriate program times.

Figure 15:
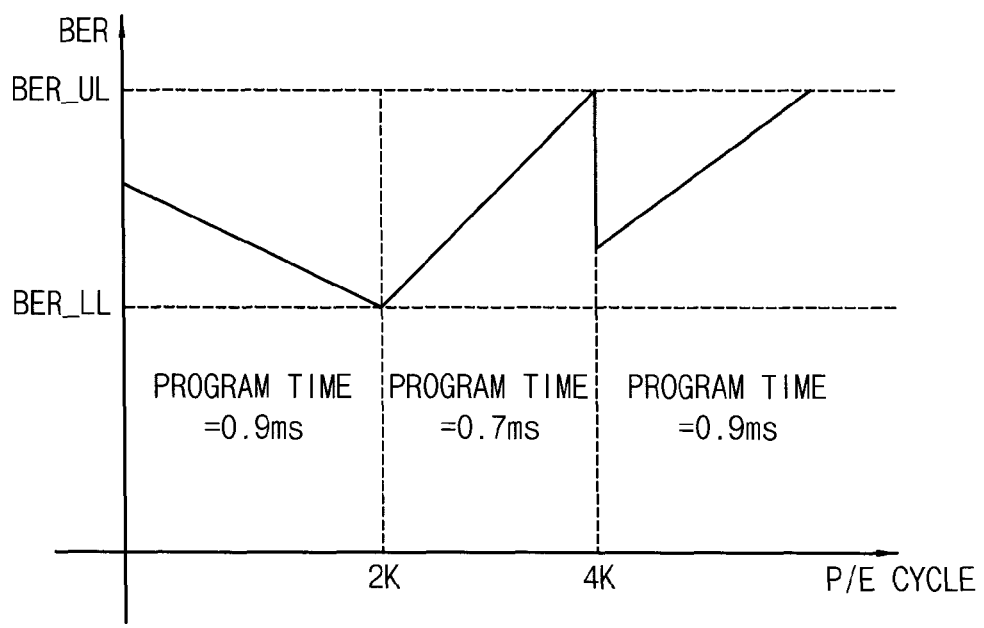
FIG. 15 is a diagram illustrating a bit error rate as a function of program/erase cycles and environmental conditions.

FIG. 15 is a timing diagram illustrating bit error rate (BER) performance over a range of program/erase (P/E) cycles under differing environment conditions.

Referring to FIG. 15, it is possible that a BER for a memory device may actually decrease under certain environment conditions, even in view of increasing P/E cycles. Indeed, a lower BER limit (BER_LL) may be established to decrease program time once reached (e.g., in the illustrated example of FIG. 15 from 0.9 ms to 0.7 ms).

Thereafter, with continued application of P/E cycles to the target memory cells, the corresponding BER will degrade until an upper BER limit (BER_UL) is reached at which time the program time is increased as described above (e.g., in the illustrated example of FIG. 15 from 0.7 ms back up to 0.9 ms).

Figure 16:
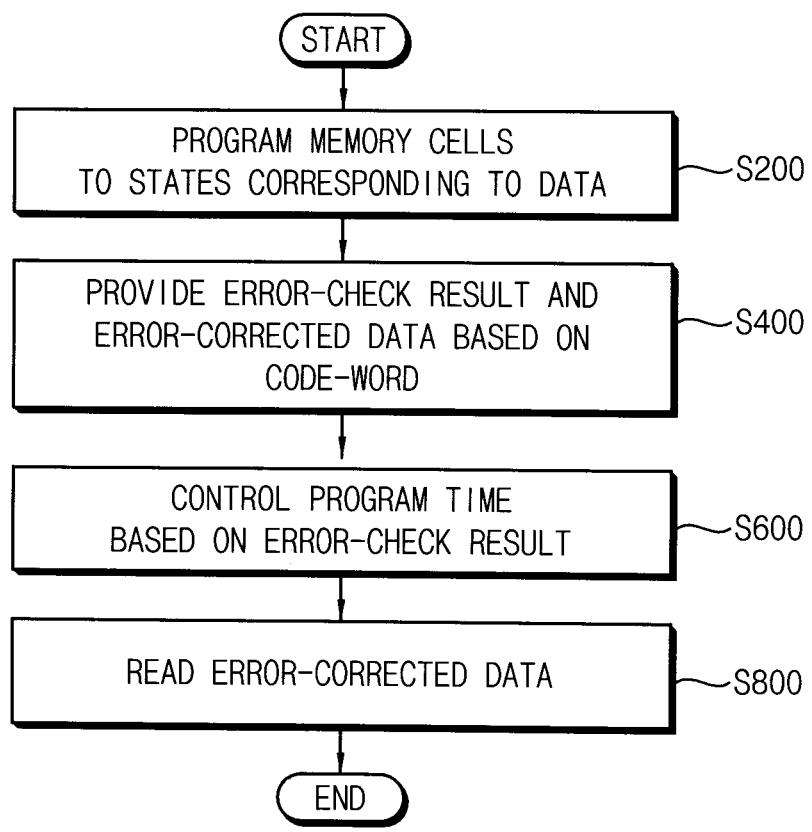
FIG. 16 is a flow chart summarizing a method of reading data from a memory device according to embodiments of the inventive concept.

FIG. 16 is a flow chart illustrating in one example a method of reading data from a memory device according to embodiments of the inventive concept.

Referring to FIG. 16, it is assumed that target memory cells have been programmed to one or more desired states in response to received write data (S200). Then, an error-check result as well as error-corrected read (or verify) data is obtained by correcting any detected error (based on a code-word CW associated with the program data) identified in the read data (S400). That is, to verify the program data previously stored in the target memory cells, a corresponding code-word including (e.g.,) program data and corresponding parity is read.

Based on the derived error-check result, the program time for the target memory cells may be controlled (S600), and the error-corrected data may be read (S800). These steps may be performed as previously described.

Figure 17:
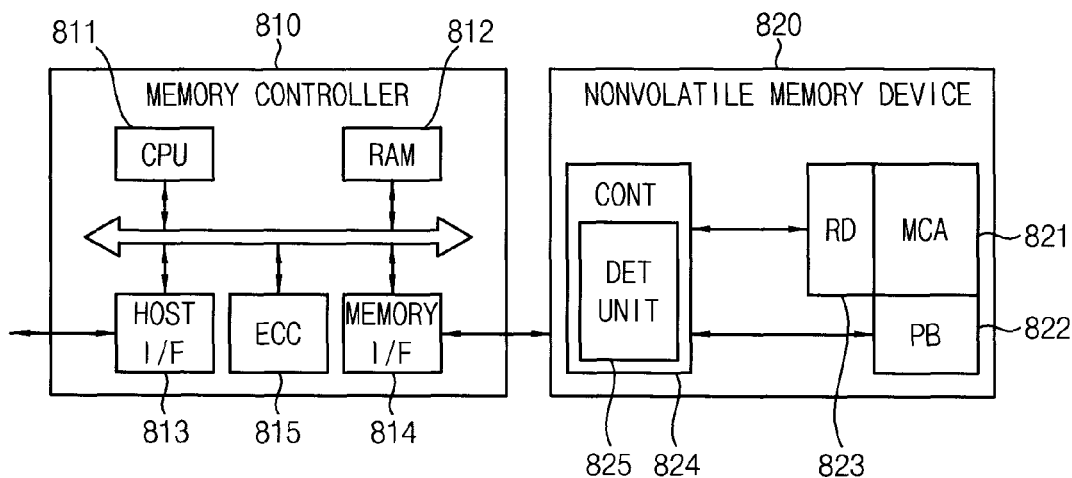
FIG. 17 is a block diagram illustrating a memory system according to embodiments of the inventive concept.

FIG. 17 is a block diagram of a memory system that may include a nonvolatile memory consistent with one or more embodiments of the inventive concept.

Referring to FIG. 17, memory system 800 generally comprises: a memory controller 810 and a nonvolatile memory device 820.

Nonvolatile memory device 820 comprises a memory cell array 821, a page buffer unit 822, a row decoder 823, and a control circuit 824. Memory cell array 821 comprises multiple memory cells, page buffer unit 822 may be operated as a write driver or a sensing amplifier according to an operation mode, and row decoder 823 may select a word line in response to a row address. Control circuit 824 controls page buffer unit 822 and row decoder 823, and may comprise a determination unit 825 which performs the second verify operation for whether a program/erase error symptom exists in the target memory cells of the memory cells.

Nonvolatile memory device 820 may further perform the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 820 may effectively prevent from being generated an error which is uncorrectable due to the generation of a progressive badness in the target memory cells determined as the state of a program/erase pass and the performance of nonvolatile memory device 820 may be improved.

Memory controller 810 controls nonvolatile memory device 820. Memory controller 810 controls a data exchange between an external host (not shown) and nonvolatile memory device 820. Memory controller 810 may include a CPU (Central Processing Unit) 811, a buffer memory 812, a host interface 813, and a memory interface 814. CPU 811 may perform an operation for the data exchange. Buffer memory 812 comprises a dynamic random access memory (DRAM), static random access memory (SRAM), PRAM, FRAM, RRAM, or MRAM. According to an embodiment of the inventive concept, buffer memory 812 may be placed at an inside or outside of controller 810.

Host interface 813 is connected to host and memory interface 814 is connected to nonvolatile memory device 820. CPU 811 communicates with the host through host interface 813. For example, host interface 813 may be configured to communicate with the host through at least one among various interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), or Integrated Drive Electronics (IDE). Further, CPU 811 may communicate with memory device 820 through memory interface 814. According to an embodiment of the inventive concept, memory controller 810 may further comprise an error correction block 815 for correcting an error. According to some embodiments of the inventive concept, memory controller 810 comprises a built-in memory device 820 or memory controller 810 and nonvolatile memory device 820 may be implemented as mutually separated chips.

Memory system 800 may be implemented in such a form as a memory card or a solid state drive. nonvolatile memory device 820, memory controller 810 and/or memory system 800 may be implemented in various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 18:
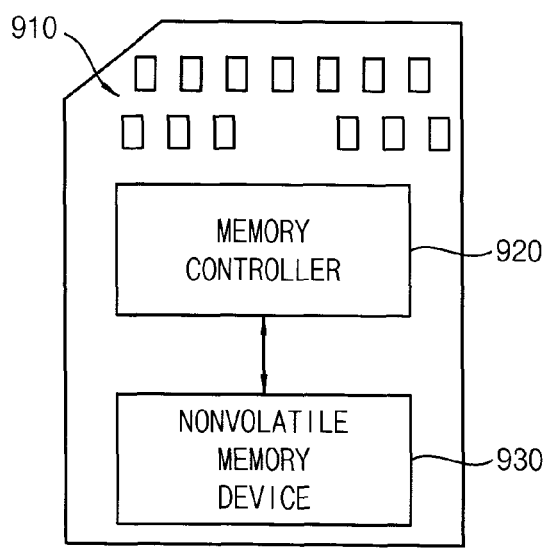
FIG. 18 is a diagram illustrating an application example of a memory system to a memory card according to embodiments of the inventive concept.

FIG. 18 is a diagram illustrating an application example of a memory system to a memory card according to embodiments of the inventive concept.

Referring to FIG. 18, a memory card 900 comprises multiple connecting pins 910, a memory controller 920 and a nonvolatile memory device 930.

Connecting pins 910 are connected to a host (not shown) such that signals are transceived between the host and memory card 900. Connecting pin 910 comprises a clock pin, a command pin, data pin and/or a reset pin.

Memory controller 920 receives data from the host and stores the received data in nonvolatile memory device 930. Nonvolatile memory device 930 further performs the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 930 may effectively prevent from being generated an error which is uncorrectable due to the generation of a progressive badness in the target memory cells determined as the program/erase pass state and the performance of nonvolatile memory device 930 may be improved.

Memory card 900 may be, for instance, a memory card such as a an Multi-Media Card (MMC), an embedded Multi-Media Card (eMMC), a hybrid eMMC, a Secure Digital (SD) card, a micro-SD card, a memory stick, an ID card, a Personal Computer Memory Card International Association (PCMCIA) card, a chip card, an USB card, a smart card, or a Compact Flash (CF) Card.

According to some embodiments of the inventive concept, memory card 900 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 19:
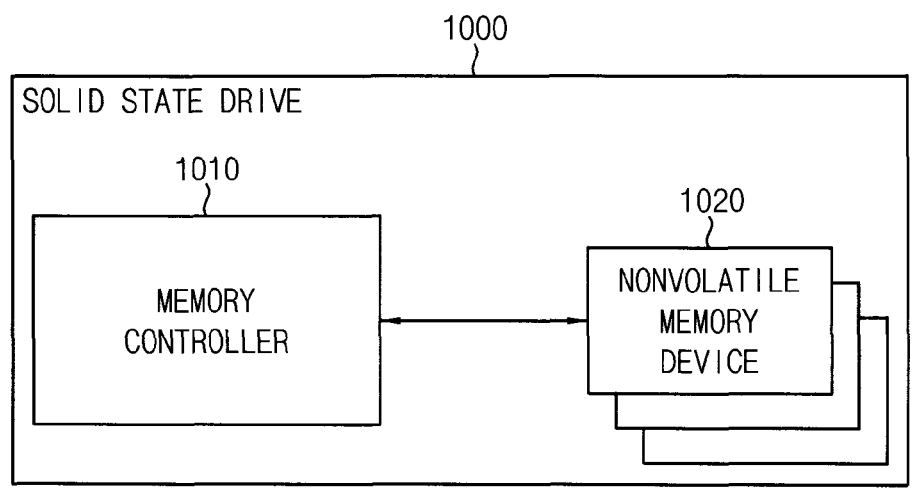
FIG. 19 is a diagram illustrating an application example of a memory system to a solid state drive according to embodiments of the inventive concept.

FIG. 19 is a diagram illustrating an application example of a memory system to a solid state drive according to example embodiments.

Referring to FIG. 19, SSD 1000 comprises a memory controller 1010 and multiple nonvolatile memory devices 1020.

Memory controller 1010 receives data from the host (not shown) and stores the received data in nonvolatile memory device 1020.

In a conventional method of programming a memory device, if the program/erase cycle is greater than a predetermined number regardless of the error check result, the memory device is programmed with a slow program speed SPS by increasing the program time. In this case, even though the memory device is programmed with a fast program speed FPS in case of a low bit error rate, because the program/erase cycle is greater than the predetermined number, the memory device may be programmed with the slow program speed SPS. Therefore even though the memory device is programmed with the fast program speed FPS, the memory device may be programmed with the slow program speed SPS and the memory device may not be used efficiently. The method of programming the memory device according to example embodiments may provide the error-check result based on the code-word that is read from the plurality of memory cells and the program time of programming the plurality of memory cells may be controlled based on the error-check result. Therefore the memory device may be efficiently used and the program time of the memory device may be decreased.

According to an embodiment of the inventive concept, SSD 1000 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 20:
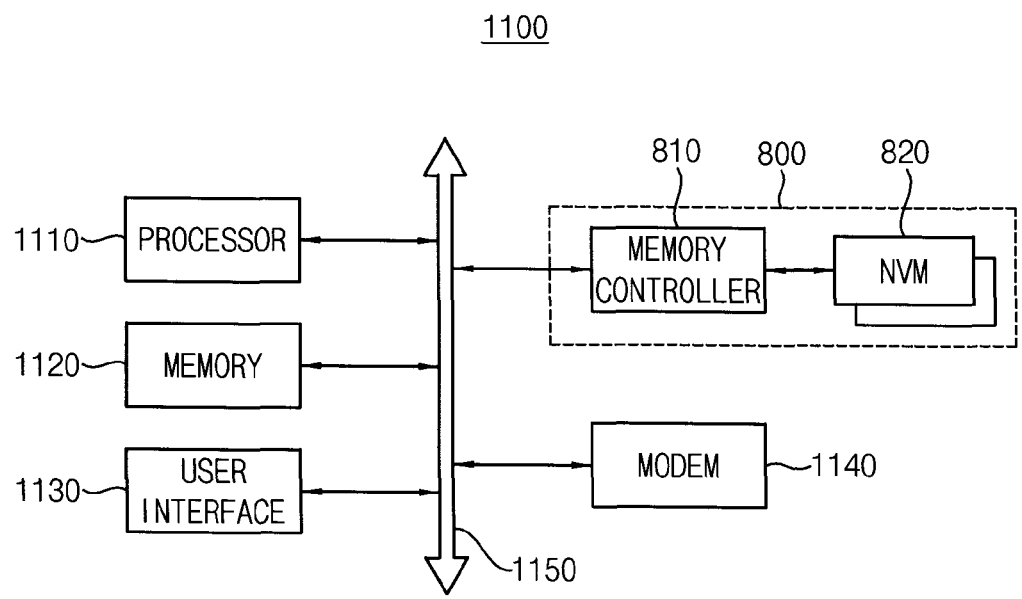
FIG. 20 is a block diagram illustrating a computing system according to embodiments of the inventive concept.

FIG. 20 is a block diagram illustrating a computing system that may incorporate one or more nonvolatile memories consistent with an embodiment of the inventive concept.

Referring to FIG. 20, computing system 1100 comprises a processor 1110, a memory device 1120, a user interface 1130, and a memory system 8000. In some embodiments, computing system 1100 further comprises a modem 1140 such as a baseband chipset.

Processor 1110 executes a specific calculation or tasks. For example, processor 1110 may be a processor or a CPU. Processor 1110 may be connected to memory device 1120 through a bus 1150 such as an address bus, a control bus or a data bus. For example, memory device 1120 may be implemented with DRAM, mobile DRAM, SRAM, PRAM, FRAM, RRAM or MRAM. Further, processor 1110 may be connected to an expansion bus such as a PCI. Thus, processor 1110 may control user interface 1130 including at least one input device such as a keyboard or a mouse, and at least one output device such as a printer or a display. Modem 1140 may wirelessly transceive data with an external apparatus. Memory device 820 may store the data processed by processor 1110 or the data received through modem 1140 through memory controller 810 therein. Computing system 1100 may further comprise a power supply for supplying an operation voltage. Further, according to an embodiment of the inventive concept, computing system 1100 may further include an application chipset, and a camera image processor (CIS).

Embodiments may be applied to, e.g., a nonvolatile memory device such as a flash memory, and various apparatuses and systems including the nonvolatile memory device. As examples, embodiments may be expansively applied to a memory card, a solid state drive, a computer, a laptop computer, a cellular phone, a smart phone, an MP3 player, a PDA, a PMP, a digital TV, a digital camera, and a portable game console.

Unlike conventional approaches that rely on counted numbers of P/E cycles, for example, embodiments of the inventive concept provide methods of programming data to target memory cells of a memory device according to a program time established in view of an error-check result derived from a code-word read from the target memory cells. In this manner, memory device may be programmed carefully and efficiently using an appropriate program regardless of the bit error rate performance of the memory device.

Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the following claims.

What is claimed is:

1. A method of programming target memory cells of a nonvolatile memory device, the method comprising:
   programming the target memory cells to at least one state corresponding to received write data, wherein once programmed to the target memory cells the write data defines program data;
   providing an error-check result based at least in part on a code-word read from the target memory cells as program data; and
   controlling a program time for a program operation subsequently used to program the target memory cells based on the error-check result,
   wherein the error-check result is a bit error rate (BER), the BER indicating an occurrence of errors in the program data stored in the target memory cells, and
   the controlling of the program time for the program operation subsequently used to program the target memory cells based on the BER comprises decreasing the program time by a unit time when the BER falls below a lower limit for the BER.

2. The method of claim 1, wherein the code-word includes at least a portion of the program data and parity data derived from the program data, such that one or more errors in the program data may be detected/corrected using the parity data.

3. The method of claim 1, wherein the providing of the error-check result and the controlling of the program time are executed after the programming of the target memory cells to at least one state corresponding to the received write data.

4. The method of claim 3, wherein the providing of the error-check result and the controlling of the program time are executed during a read operation executed by the nonvolatile memory device.

5. The method of claim 1, wherein the target memory cells are arranged in a flash memory cell array including NAND flash memory cells.

6. The method of claim 5, wherein the memory cell array comprises multiple strings of NAND flash memory cells arranged in a vertical structure.

7. A method of programming target memory cells of a nonvolatile memory device, the method comprising:
   programming the target memory cells to at least one state corresponding to received write data, wherein once programmed to the target memory cells the write data defines program data;
   providing an error-check result based at least in part on a code-word read from the target memory cells as program data; and
   controlling a program time for a program operation subsequently used to program the target memory cells based on the error-check result,
   wherein the providing of the error-check result and the controlling of the program time are executed only after a number of program operations have been executed greater than a program verification number (PVN), and
   respective program times for each one of a number of blocks in the nonvolatile memory device are controlled by assigning different program verification numbers (PVNs) to each block.

8. The method of claim 7, wherein the number of blocks includes an outer block having an assigned first PVN, and a center block having an assigned second PVN, and
   the first PVN is greater than the second PVN.

9. The method of claim 7, wherein the code-word includes at least a portion of the program data and parity data derived from the program data, such that one or more errors in the program data may be detected/corrected using the parity data.

10. The method of claim 7, wherein the providing of the error-check result and the controlling of the program time are executed after the programming of the target memory cells to at least one state corresponding to the received write data.

11. The method of claim 10, wherein the providing of the error-check result and the controlling of the program time are executed during a read operation executed by the memory device.

12. A method of programming target memory cells of a nonvolatile memory device, the method comprising:
   programming the target memory cells to at least one state corresponding to received write data, wherein once programmed to the target memory cells the write data defines program data;
   providing an error-check result based at least in part on a code-word read from the target memory cells as program data; and
   controlling a program time for a program operation subsequently used to program the target memory cells based on the error-check result,
   wherein the providing of the error-check result and the controlling of the program time are executed only after a number of erase operations have been executed greater than an erase verification number (EVN), and
   respective program times for each one of a number of blocks in the nonvolatile memory device are controlled by assigning different erase verification numbers (EVNs) to each block.

13. The method of claim 12, wherein the number of blocks includes an outer block having an assigned first EVN, and a center block having an assigned second EVN, and
   the first EVN is greater than the second EVN.

14. The method of claim 12, wherein the code-word includes at least a portion of the program data and parity data derived from the program data, such that one or more errors in the program data may be detected/corrected using the parity data.

15. The method of claim 12, wherein the providing of the error-check result and the controlling of the program time are executed after the programming of the target memory cells to at least one state corresponding to the received write data.

16. The method of claim 15, wherein the providing of the error-check result and the controlling of the program time are executed during a read operation executed by the memory device.

* * * * *